(12) United States Patent
Choi et al.

(10) Patent No.: US 8,248,103 B2
(45) Date of Patent: *Aug. 21, 2012

(54) OUTPUT CIRCUIT OF SEMICONDUCTOR DEVICE

(75) Inventors: Chang-Kyu Choi, Gyeonggi-do (KR); Kyung-Hoon Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/043,873

(22) Filed: Mar. 9, 2011

(65) Prior Publication Data

US 2011/0156791 A1 Jun. 30, 2011

Related U.S. Application Data

(63) Continuation of application No. 12/347,446, filed on Dec. 31, 2008, now Pat. No. 7,924,060.

(30) Foreign Application Priority Data

Apr. 30, 2008 (KR) .................. 10-2008-0040933

(51) Int. Cl.
*H03K 19/0175* (2006.01)
(52) U.S. Cl. .................. 326/82; 326/114; 327/407

(58) Field of Classification Search .......... 326/112–114, 326/93; 327/331, 306, 99, 407–408
See application file for complete search history.

(56) References Cited

U.S. PATENT DOCUMENTS

| 7,092,180 B2 * | 8/2006 | Franck ............................ 360/46 |
| 7,924,060 B2 * | 4/2011 | Choi et al. ..................... 326/113 |
| 2003/0080800 A1 * | 5/2003 | Kuttner ......................... 327/408 |

FOREIGN PATENT DOCUMENTS

| CN | 1166740 | 12/1997 |
| CN | 2552083 | 5/2003 |
| CN | 1442955 | 9/2003 |

OTHER PUBLICATIONS

Office Action issued from Chinese State Intellectual Property Office on Sep. 13, 2011.

* cited by examiner

*Primary Examiner* — James H Cho
(74) *Attorney, Agent, or Firm* — IP & T Group LLP

(57) ABSTRACT

An output circuit of a semiconductor device includes a signal selector configured to receive first and second input data signals and sequentially outputting the first and second input data signals in response to a phase signal; and an output level controller configured to control a voltage level of an output signal of the signal selector based on the first and second input data signals.

15 Claims, 8 Drawing Sheets

OUTPUT CIRCUIT OF SEMICONDUCTOR DEVICE

CROSS-REFERENCE TO RELATED APPLICATION

This application is a continuation of U.S. patent application Ser. No. 12/347,446 filed on Dec. 31, 2008 and issued as U.S. Pat. No. 7,924,060 on Apr. 12, 2011, which claims priority of Korean patent application number 10-2008-0040933, filed on Apr. 30, 2008. The disclosure of each of the foregoing applications is incorporated herein by reference in its entirety.

BACKGROUND OF THE INVENTION

The present invention relates to an output circuit of a semiconductor device, and more particularly, to an output circuit of a semiconductor device which is capable of reducing jitter caused by limiting a swing width/a voltage swing of an output signal. The swing width of the output signal signifies a voltage width between a high voltage level and a low voltage level thereof.

FIG. 1 is a block diagram showing a conventional output circuit for a semiconductor device.

As shown, the conventional output circuit includes a first pass gate, 101, a second pass gate 103, and an output inverter 105. If a first clock signal is inputted to the first pass gate 101 and the second pass gate 103, the first pass gate 101 is turned on so that a first input signal DATA 1 is outputted through the output inverter 105. The phase of a second clock signal is opposed to that of the first clock signal.

If the second clock signal is inputted to the first pass gate 101 and the second pass gate 103, the second pass gate 103 is turned on so that a second input signal DATA 2 is outputted through the output inverter 105.

FIG. 2 is another block diagram illustrating a conventional output circuit used in a semiconductor device.

As shown in FIG. 2, a first tri-state inverter 201 and a second tri-state inverter 203 are used instead of the first pass gate 101 and the second pass gate 103. The first and second tri-state inverters 201 and 203 inherently include an inverter functioning differently from a pass gate. Therefore, the output circuit does not use the inverter in front of the first tri-state inverter 201 and the second tri-state inverter 203 in order to obtain the same output with the output circuit shown in FIG. 1. Except for this point, the output circuit has the same configuration as the output circuit shown in FIG. 1.

The output circuit may output signals in series wherein input signals are inputted in parallel. In this case, the output circuit employs the first and second clock signals as control signals, wherein each of the clock signals has a phase opposite to the other, and is inputted to the output circuit.

In a conventional output circuit, two pass gates 101 and 103 or two inverters 201 and 203 are connected to the output inverter 105 at a node A where a high capacitance exists. The high capacitance is caused by a gate capacitance of the output inverter 105 and a junction capacitance of two pass gates 101 and 103 or two inverters 210 and 203.

High capacitance appearing on node A limits the swing width of a out signal having high frequency. Here, the swing width means voltage width/span between a high voltage level and a low voltage level of the output signal. An output signal having low frequency is not influenced by high capacitance. On the other hand, an output signal having high frequency is restricted in the swing width due to high capacitance. Consequently, the swing width of the output signal having the high frequency is limited.

Here, frequency means the number of transitions of voltage levels of an output signal per unit time. Therefore, an output signal having the low frequency means that the output signal has a small number of transitions.

For example, when both of the first and second input signals inputted in parallel to the output circuit shown in FIGS. 1 and 2, have a high voltage level or a low voltage level, the output circuit consecutively outputs high or low voltage levels. In this case, an output signal having a small number of transitions of logic voltage level is regarded as a low frequency output signal.

On the other hand, when the first and second input signals inputted in parallel to the output circuit shown in FIGS. 1 and 2, and one is input signal has a high voltage level while the other has a low voltage level, an output signal of the output circuit of FIGS. 1 and 2 transits from high voltage to low voltage level. That is, if the output signal has a large number of transitions of a logic level, then it is regarded as a high frequency output signal.

Consequently, the swing width of an output signal having a high frequency is limited due to the high capacitance, and this cause a problem of jitter appearing in the output signal. Specifically, this problem may become serious if the output circuit operates at high speed.

SUMMARY OF THE INVENTION

Exemplary embodiments of the present invention are directed to providing an output circuit of a semiconductor device which is capable of effectively reducing jitter caused by limiting a swing width/voltage span of an output signal.

In accordance with an aspect of the present invention, there is provided an output circuit of a semiconductor device, including a signal selector configured to receive first and second input data signals and sequentially outputting the first and second input data signals in response to a phase signal; and an output level controller configured to control a voltage level of an output signal of the signal selector based on the first and second input data signals.

In accordance with another aspect of the present invention, there is provided an output circuit of a semiconductor device, including a signal selector configured to receive a plurality of input signals and sequentially outputting the input signals in response to a plurality of control signals; and an output level controller configured to detect whether an output signal of the signal selector has characteristics of a low frequency or a high frequency to reduce a swing width of an output signal of the signal selector in response to the detected signal.

In accordance with still another aspect of the present invention, there is provided an output circuit for a semiconductor device, including a signal selector configured to receive a plurality of input signals and sequentially outputting the input signals in response to a plurality of clock signals; and an output level controller configured to feed-forward/receive the plurality of input signals and pre-driving an output node of the signal selector.

In accordance with a further another aspect of the present invention, there is provided an output circuit of a semiconductor device, including a signal transmitter for transmitting an input signal to an output node in response to a control signal; and an output level controller for pre-driving the output node based on the input signal.

DESCRIPTION OF SPECIFIC EMBODIMENTS

Other objects and advantages of the present invention can be understood by the following description of the exemplary embodiments of the present invention.

Figure 1:
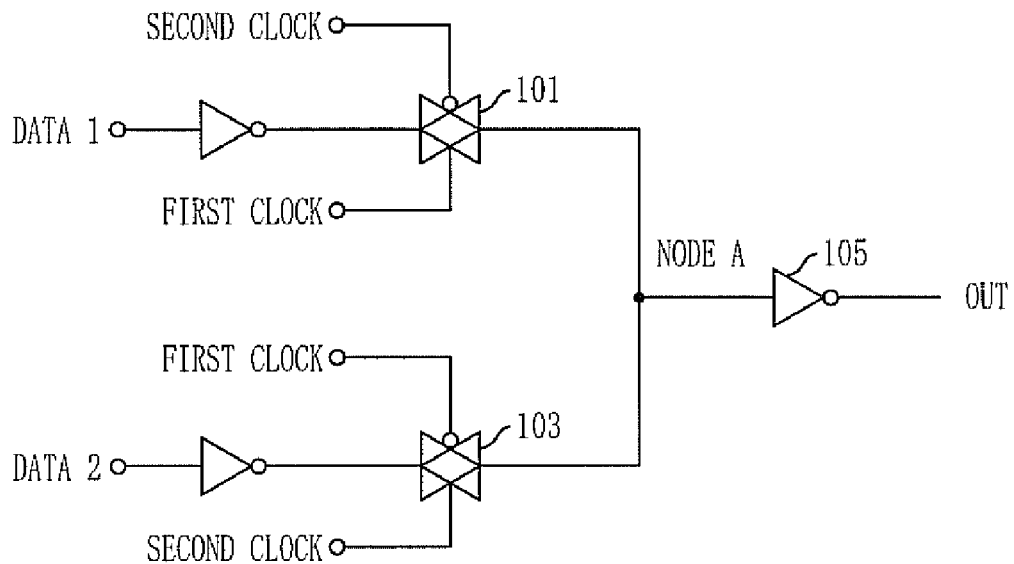
FIGS. 1 and 2 are circuit diagrams showing a conventional output circuit.
Figure 2:
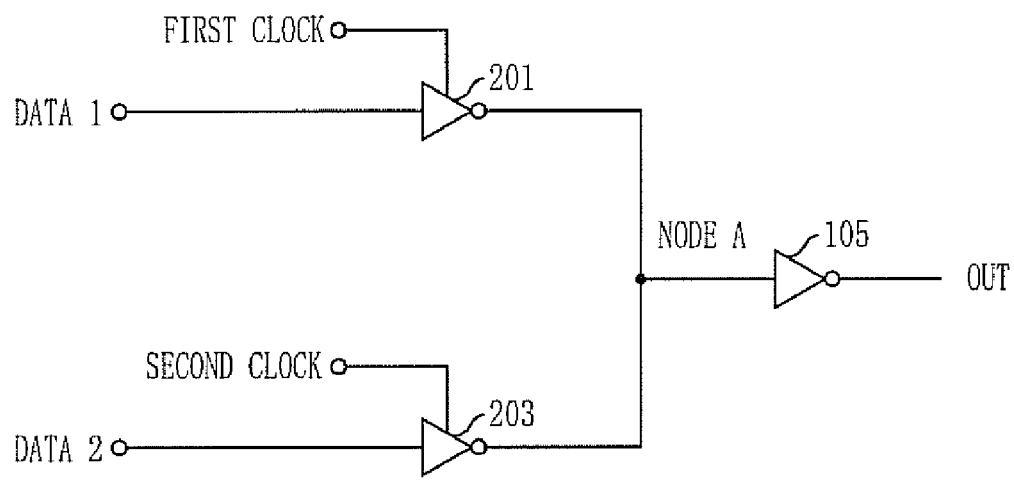
Figure 3:
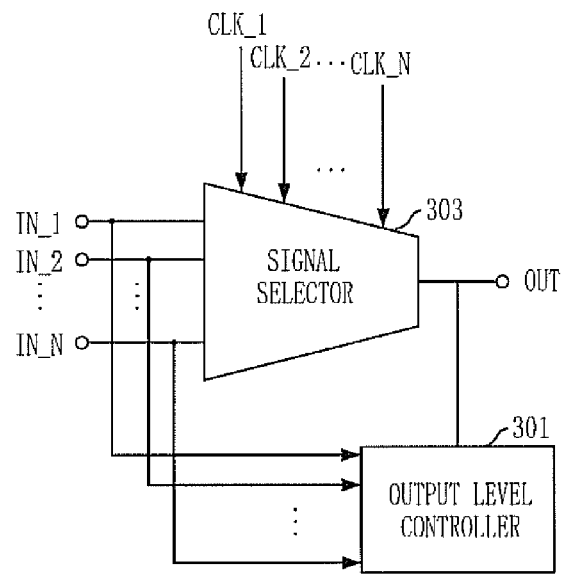
FIG. 3 is a block diagram illustrating an output circuit in accordance with an embodiment of the present invention.

FIG. 3 is a block diagram showing an output circuit in accordance with an embodiment of the present invention.

As shown, the output circuit includes a signal selector 303 and an output level controller 301. The signal selector 303 receives several input signals IN_1 to IN_N and outputs them as an output signal OUT in a sequence in response to a plurality of clock signals CLK_1 to CLK_N. The output level controller 301 detects whether the output signal OUT has characteristics of a low frequency or a high frequency to thereby reduce a voltage swing of the output signal OUT of the signal selector 303 in response to the detected result.

Each of the input signals IN_1 to IN_N is inputted to the signal selector 303 in parallel. The signal selector 303 selects the input signals IN_1 to IN_N in response to the clock signals CLK_1 to CLK_N. The input signals IN_1 to IN_N are sequentially outputted as the output signal OUT. The output level controller 301 is connected to an output node of the signal selector 303. When the output signal OUT of signal selector 303 has a low frequency, the output level controller 301 reduces the swing width of the output signal OUT.

When the output signal OUT has a high frequency in a conventional output circuit, the output signal OUT may not have a full swing width due to a high capacitance appearing in the output node of the signal selector 303. On the other hand, when the output signal OUT has a low frequency in the conventional output circuit, the output signal OUT of a low frequency may have a full swing width. As a result, in the conventional output circuit, the output signal OUT of low frequency may only reach to an enough voltage level in comparison with an original high or low voltage level of the input signals.

In accordance with the present invention, when the output signal OUT of signal selector 303 has characteristics of a low frequency, the output circuit reduces the swing width of an output signal OUT. That is, in order to achieve the purpose of the present invention, the swing width of the output signal OUT with characteristics of a low frequency is controlled to correspond to that of an output signal OUT with characteristics of a high frequency.

In accordance with the present invention, an output level controller 301 senses whether the output signal OUT has characteristics of a high frequency or a low frequency. The output level controller 301 controls a voltage level of the output signal OUT of the signal selector 303. When the output signal OUT has a low frequency, the output level controller 301 raises the voltage level of the output signal OUT with a low frequency over a low voltage level, and reduces the voltage level of the output signal OUT with a low frequency under a high voltage level. Thus, the swing width of the output signal OUT with a low frequency is reduced. Consequently, the difference between the swing width of the output signal OUT with a low frequency and that of the output signal OUT with a high frequency is reduced.

This reduction in the difference of the swing width reduces jitter appearing in the output signal OUT wherein the jitter is caused by limiting the swing width of the output signal OUT having a high frequency. Therefore, the high speed operation of the output circuit is also possible.

Figure 4:
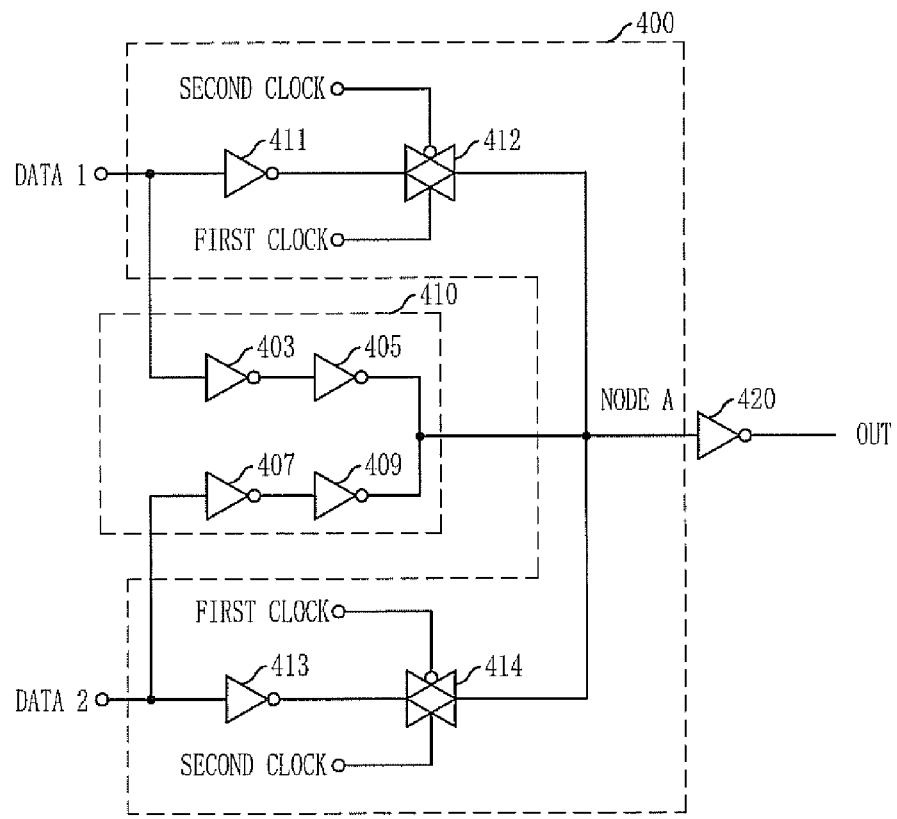
FIG. 4 is a detailed circuit diagram illustrating an output circuit in accordance with an embodiment of the present invention.

FIG. 4 is a detailed circuit diagram illustrating an output circuit in accordance with an embodiment of the present invention.

As shown, the output circuit of the present invention includes a signal selector 400 and an output level controller 410. The signal selector 400 receives first and second input signals DATA 1 and DATA 2 and outputs them in turn as an output signal in response to first and second clock signals as a control signal. The output level controller 410 controls a voltage level of the output signal output from the signal selector 400 based on the first and second input signals DATA 1 and DATA 2.

When voltage levels of the first and second input signals DATA 1 and DATA 2 are the same, the output level controller 410 outputs a signal having a voltage level opposite to that of the output signal of the signal selector 400. Therefore, the output level controller 410 reduces a swing width of the output signal of the signal selector 400. When the voltage levels of the first and second input signals DATA 1 and DATA 2 are not the same, the output level controller 410 pre-charges an output node NODE A of the signal selector 400 up to a predetermined voltage. Therefore, the output level controller 410 reduces the swing width of the output signal of the signal selector 400.

Figure 8:
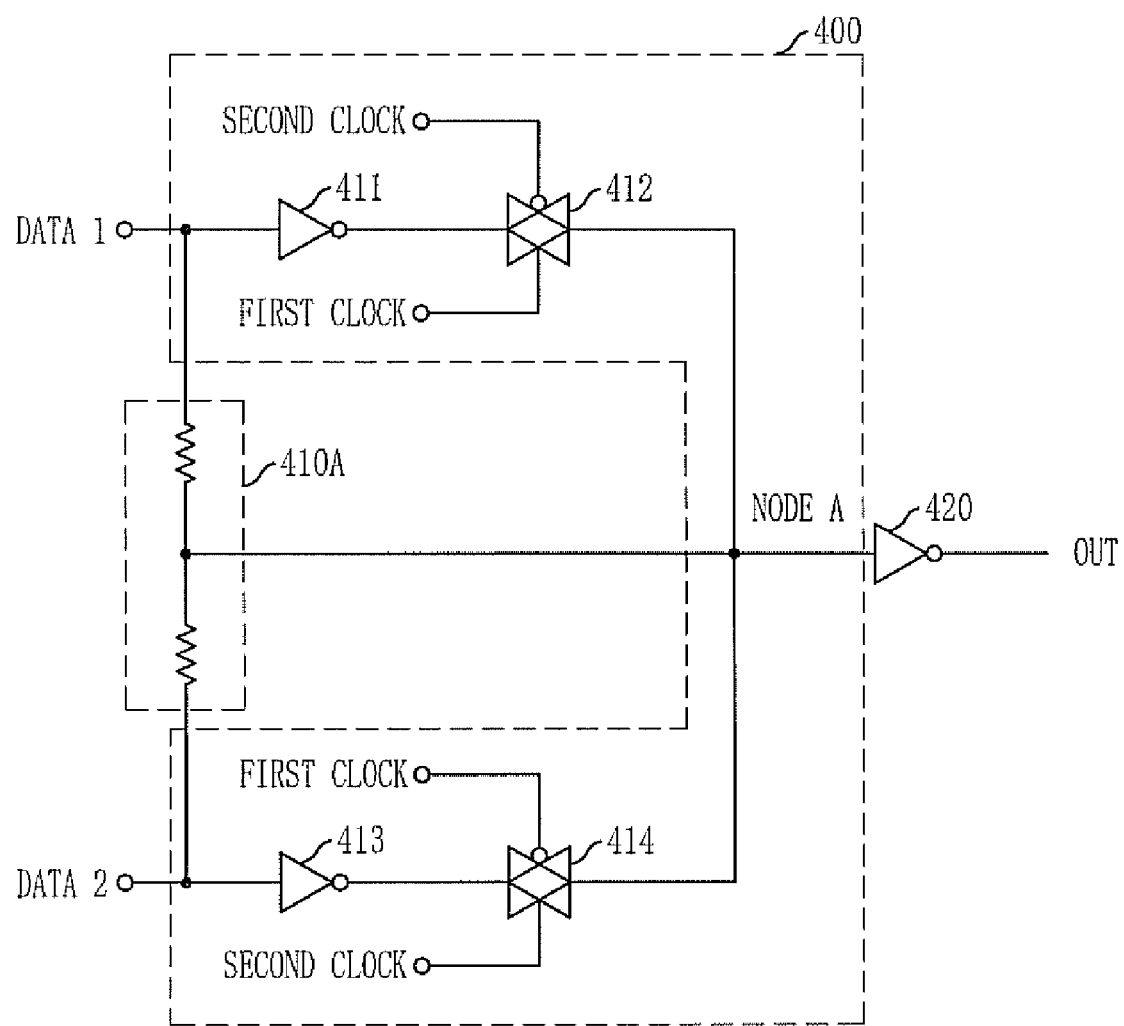
FIGS. 8 to 10 are detailed circuit diagrams of an output circuit in accordance with another embodiment of the present invention.
Figure 9:
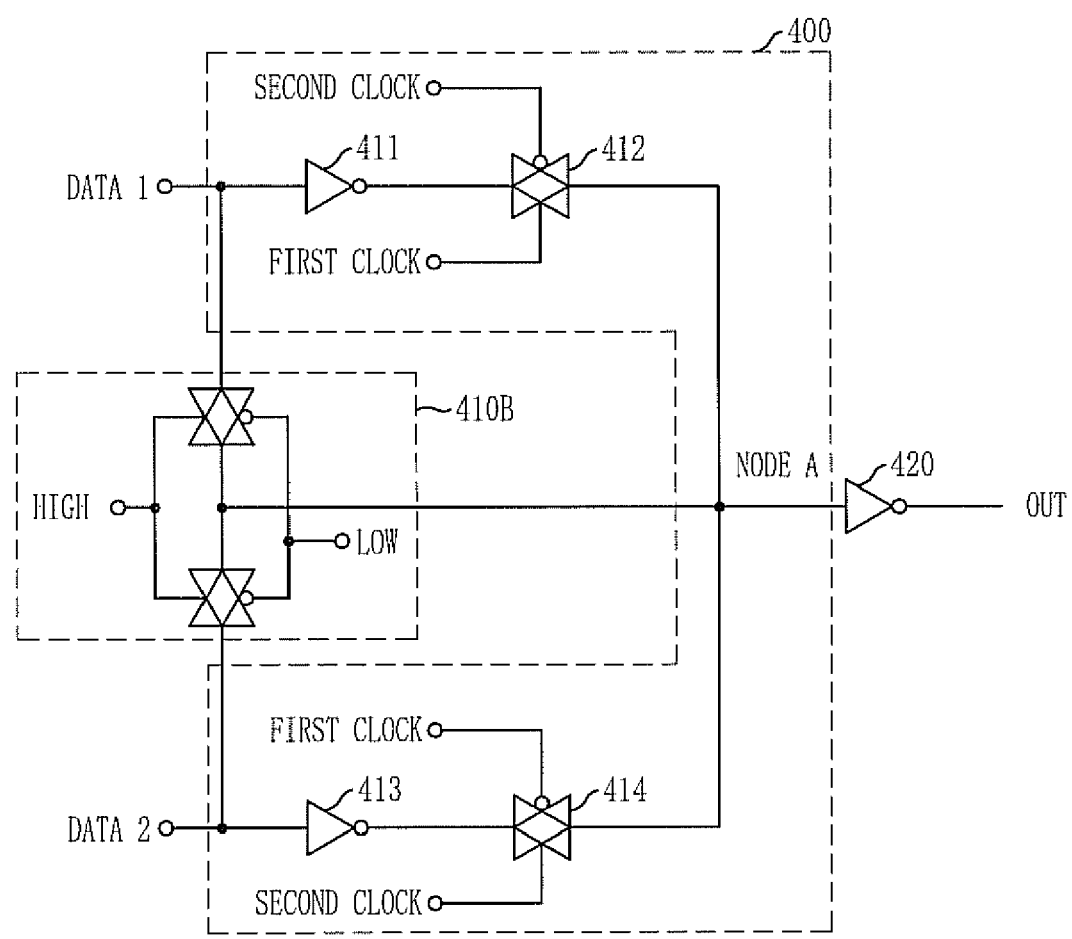
Figure 10:
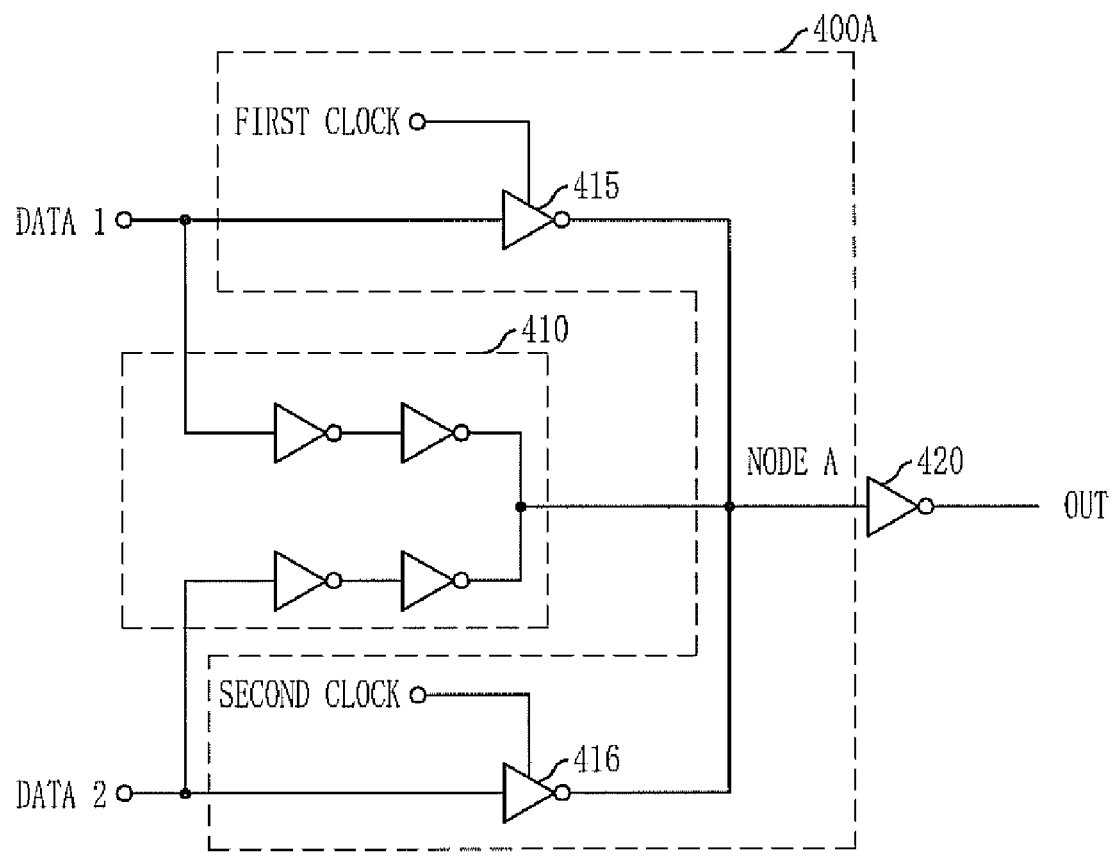

In FIG. 4, the output level controller 410 includes first and second drivers. The first driver includes two inverters 403 and 405 and outputs an output signal to the output node NODE A of the signal selector 400 in response to the first input signal DATA 1. The second driver includes two inverters 407 and 409 and outputs an output signal to the output node NODE A of the signal selector 400 in response to the second input signal DATA 2. The present invention is not limited to this configuration of inverters. A variety of embodiments of the output level controller 410 are illustrated in FIGS. 8 to 10.

Each of the first and the second input signals DATA 1 and DATA 2 is inputted to the first and the second pass gates 412 and 414 through two inverters 411 and 413. The first and the second input signals DATA 1 and DATA 2 are inverted by the two inverters 411 and 413, and sequentially transmitted to the output node NODE A of the signal selector 400 as the output signal in response to the first and the second clock signals. The first and the second clock signals are a phase signal inputted to the signal selector 400 as a control signal. The first clock signal has a phase opposite to that of the second clock signal.

Meanwhile, the first and second input signals DATA 1 and DATA 2 are also inputted to the output level controller 410. Each of the first and second input signals DATA 1 and DATA 2 inputted to the output level controller 410 is outputted through the inverters 403 and 405 or the inverters 407 and 409. Each pair of the inverters 403 and 405 or the inverters 407 and 409 is connected in series. A signal outputted from the output level controller 410 is obtained by combining the first input signal DATA 1 with the second input signal DATA 2 outputted from the inverters 403, 405, 407 and 409.

The output signal OUT of the output circuit should be able to be detected as original logic levels of inputted signals. Therefore, it is desirable that a driving power of the output level controller 410 is smaller than that of the signal selector 400. For example, if a ratio of channel-width to channel-length of a transistor contained in an inverter becomes smaller, a driving ability of inverter becomes smaller. In this case, the driving power of the output level controller 410 is smaller than that of the signal selector 400.

Therefore, although the signal outputted from the output level controller 410 and the signal outputted from the first and second pass gates 412 and 414 are combined at an input node of an output inverter 420, there is no voltage or signal distortion at the output node NODE A of signal selector 400.

In addition, it is desirable that the output level controller 410 pre-drives the output node NODE A of the signal selector 400 and generates a signal having an opposite voltage level before outputting the signal output from the signal selector 400.

When both of the first and second input signals DATA 1 and DATA 2 have high voltage levels, all of the signals outputted from the first and second pass gates 412 and 414 become low voltage levels by the first and second inverters 411 and 413. On the other hand, the signal outputted from the output level controller 410 has a high voltage level. Consequently, a low voltage level of the signal inputted to the output inverter 420 is slightly higher than that of the signal outputted from the first and second pass gates 412 and 414. For example, the voltage level of the signal inputted to the output inverter 420 is slightly higher than a voltage level of a ground voltage VSS.

When both of the first and second input signals DATA 1 and DATA 2 have low voltage levels, all of signal outputted from the first and second pass gates 412 and 414 become high voltage levels. On the other hand, the signal outputted from the output level controller 410 has a low voltage level. Consequently, a voltage level of the signal inputted to the output inverter 420 is slightly lower than a high voltage level of the signal outputted from the first and second pass gates 412 and 414. For example, a voltage level of the signal inputted to the output inverter 420 is slightly lower than a voltage level of a power supply voltage VDD.

That is, when the first and second input signals DATA 1 and DATA 2 have the same voltage level, the output level controller 410 pre-drives the output node NODE A of the signal selector 400 and outputs a signal of a voltage level opposite to that of the output signal of the signal selector 400 on the output node NODE A of the signal selector 400 before outputting the signal from the signal selector 400. Consequently, the output level controller 410 reduces the swing width of the output signal of the signal selector 400.

When one of the first and second input signals DATA 1 and DATA 2 has a high voltage level and the other has a low voltage level, each of the signals outputted from the first and second pass gates 412 and 414 becomes a low voltage level and a high voltage level, respectively. The first and the second input signals DATA 1 and DATA 2 inputted to the output level controller 410 interfere with each other. Thus, the output node NODE A of the output level controller 410 is pre-charged as a predetermined voltage level, for example, VDD/2. The pre-charge is performed before outputting the signal from the first and second pass gates 412 and 414 by sampling clock signals.

That is, the output level controller 410 pre-drives the output node NODE A of the first and second pass gates 412 and 414, i.e., the signal selector 400. Consequently, the signal inputted in the output inverter 420 swings to a high or a low voltage level in the state pre-charged as, for example, VDD/2. The output node NODE A of output level controller 410 and the output node NODE A of signal selector 400 are the same node.

After all, in accordance with the present invention, as an output signal of output circuit, a voltage level of the output signal of the output circuit, having a low frequency, is higher than a low voltage level of a conventional output circuit and is lower than a high voltage level of the conventional output circuit. The swing width of the output signal having a low frequency is reduced. Consequently, the difference between the swing width of the output signal having a low frequency and the swing width of the output signal having a high frequency is reduced. In addition, when a signal having a high frequency is outputted, a signal inputted to the output inverter 420 swings from a high voltage level to a low voltage level in a state pre-charged up to, for example, a voltage level of VDD/2. Therefore, a fast swing action in the output circuit is possible.

Figure 5:
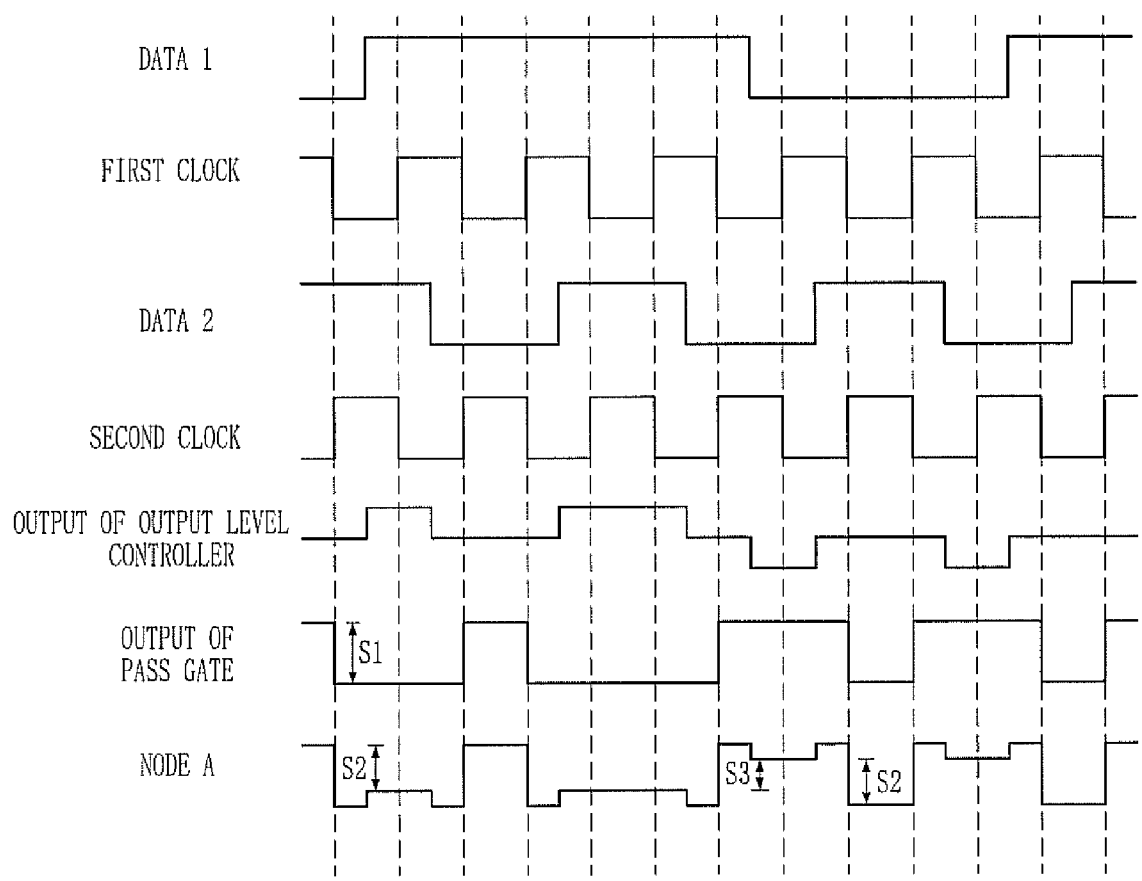
FIG. 5 is a timing diagram of the output circuit shown in FIG. 4.

FIG. 5 is a timing diagram of the output circuit shown in FIG. 4.

As illustrated, the first input signal DATA 1 is outputted through the first pass gate 412 turned on in response to the first clock signal. The second input signal DATA 2 is outputted through the second pass gate 414 turned on in response to the second clock signal. Here, the signals outputted from the first and second pass gates 412 and 414 are inversed signals of the first and second input signals DATA 1 and DATA 2, which are obtained by the inverters 411 and 413.

Meanwhile, the first and second input signals DATA 1 and DATA 2 inputted to the output level controller 410 are combined and outputted while not inversed. At this time, a driving power of the output level controller 410 is smaller than a driving power of the signal selector 400.

In addition, when both the first and second input signals DATA 1 and DATA 2 have a high voltage level, the signals outputted from the first and second pass gates 412 and 414 have a low voltage level. On the other hand, the signal outputted from the output level controller 410 has a high voltage level. Consequently, a voltage level of the signal inputted in the output inverter 420 is slightly higher than a low voltage level of signal outputted from the first and second pass gates 412 and 414.

When both the first and second input signals DATA 1 and DATA 2 have a low voltage level, the signals outputted from the first and second pass gates 412 and 414 have a high voltage level. On the other hand, a signal outputted from the output level controller 410 has a low voltage level. Consequently, a voltage level of the signal inputted in the output inverter 420 is slightly lower than a high voltage level of the signal outputted from the first and second pass gates 412 and 414.

Next, when one of the first and second input signals DATA 1 and DATA 2 has a high voltage level and another has low voltage level, the signals outputted from the first and second pass gates 412 and 414 have low and high voltage levels as signals are inversed. The output node NODE A of the output level controller 410 is pre-charged, e.g., voltage of VDD/2. Consequently, the signal inputted in the output inverter 420 is swung to high and low voltage levels in the state which is pre-charged, e.g., voltage of VDD/2.

As shown in FIG. 5, when both of the first and second input signals DATA 1 and DATA 2 have a low voltage level or a high voltage level, swing widths S2 and S3 of the signal input to the output inverter 420 are smaller than the swing width S1 of the output signal of the signal selector 400. According to the embodiment of the present invention illustrated in FIG. 5, the voltage level of the signal outputted with characteristics of a low frequency is higher than the existing low voltage level or lower than the existing high voltage level. Therefore, the swing width of the output signal with characteristics of a low frequency is reduced. Consequently, difference between the swing width of the output signal with characteristics of a low frequency and the swing width of the output signal with characteristics of a high frequency is reduced. In addition, when the output signal of the output circuit has characteristics of a high frequency, the signal inputted to the output inverter 420 is swung to high or low voltage level in the state which is pre-charged, e.g., voltage of VDD/2. Therefore, fast swing can be performed.

Figure 6:
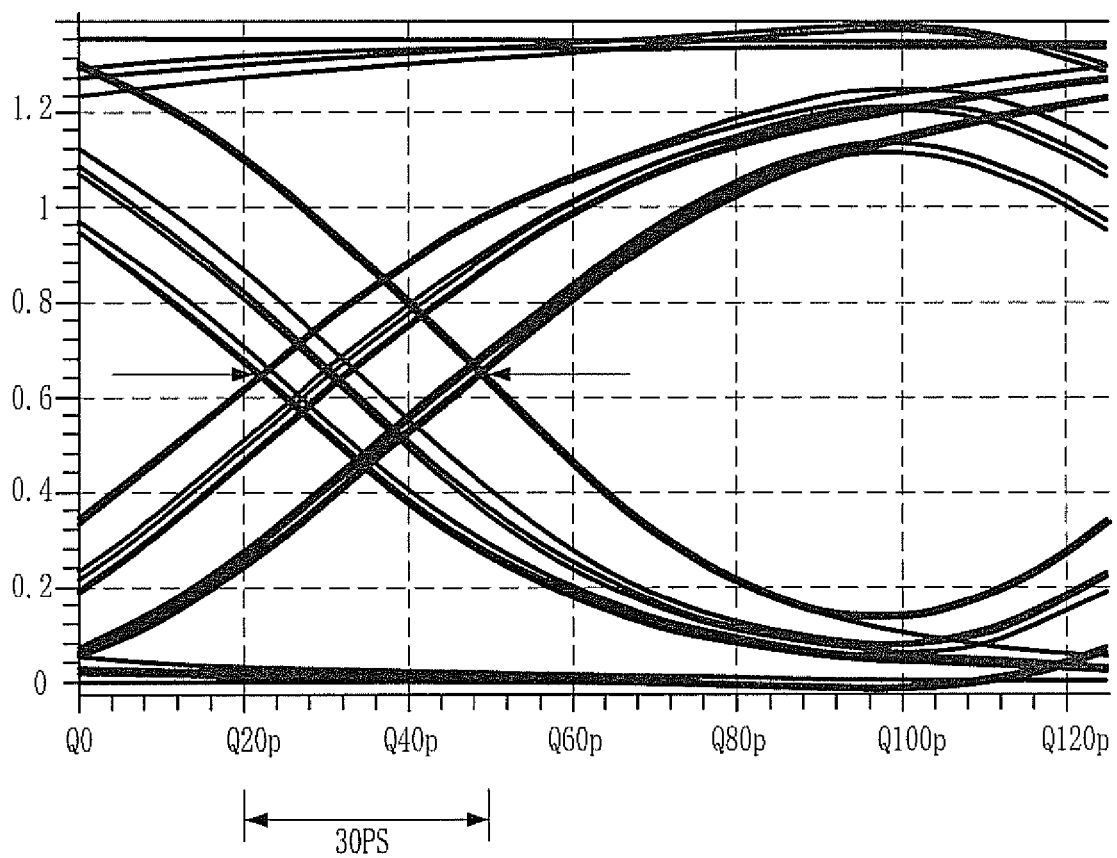
FIG. 6 is an eye diagram illustrating an output signal of the conventional output circuit.
Figure 7:
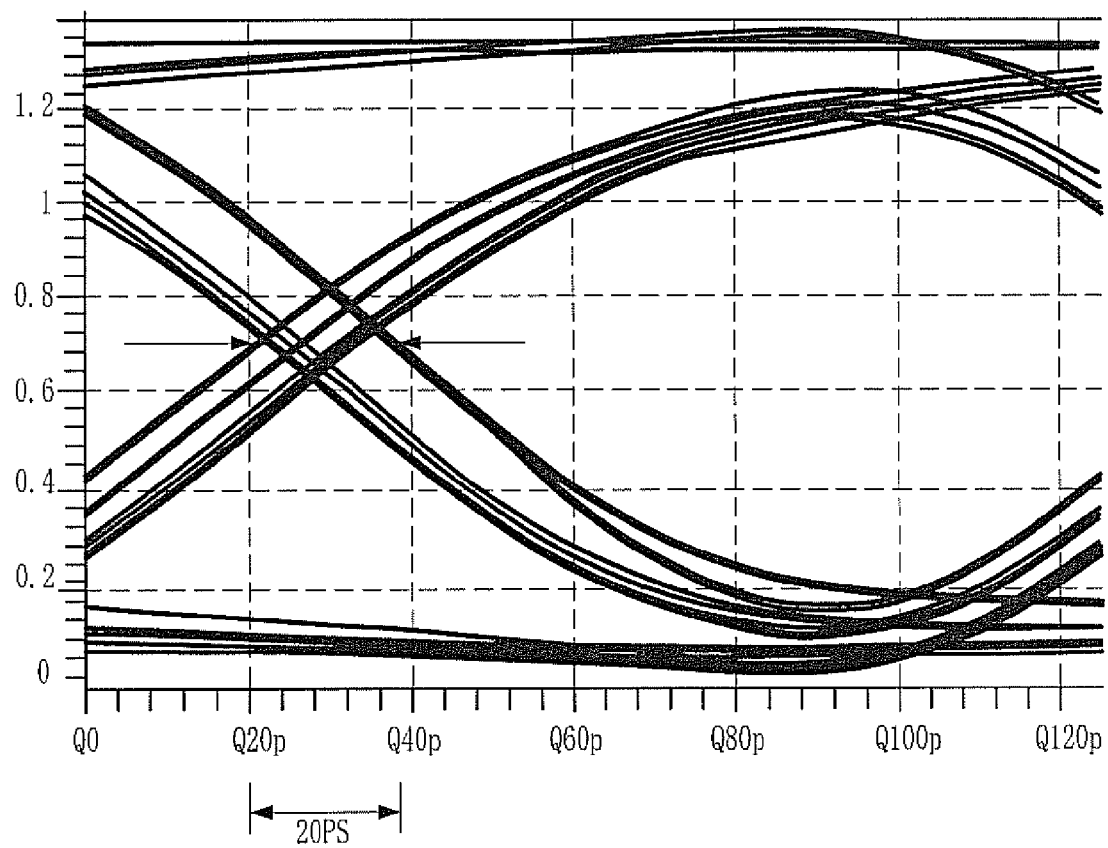
FIG. 7 is an eye diagram illustrating an output signal of an output circuit in accordance with an embodiment of the present invention.

FIG. 6 is an eye diagram illustrating an output signal of the conventional output circuit. FIG. 7 is an eye diagram illustrating the output signal of the output circuit in accordance with the embodiment of the present invention.

According to the conventional technology illustrated in FIGS. 6 and 7, jitter of the output signal is about 30 ps. On the other hand, in accordance with the embodiment of the present invention, jitter of the output signal is under 20 ps. That is, as it can be seen from FIGS. 6 and 7, in accordance with the present invention, a swing width of the output signal with characteristics of a low frequency as the output signal of the output circuit is reduced. Consequently, difference between the swing width of the output signal with characteristics of a low frequency and the swing width of the output signal with characteristics of a high frequency is reduced. In addition, when a signal with characteristics of a high frequency is outputted, a signal inputted to the output inverter 420 is swung to high or low voltage level in the state which is pre-charged, e.g., voltage of VDD/2. Therefore, a jitter of the output signal is reduced.

FIGS. 8 to 10 are diagrams of the output circuit, in accordance with other embodiments of the present invention. In FIGS. 8 to 10, In FIG. 5, the elements which are identical with the constituent elements shown in FIG. 4 are assigned the same reference numerals, and explanations thereof will be omitted.

According to FIGS. 8 and 9, the first and second drivers of the output level controller 410 include a resistor assembly. The output level controller 410A of FIG. 8 includes two resistances instead of inverters 403, 405, 407 and 409 of FIG. 4. The output level controller 410B of FIG. 9 includes two pass gates. FIG. 10 illustrates an embodiment where the signal selector 400 is formed of tri-state inverters 415 and 416.

Embodiments of FIGS. 8 to 10 illustrate a variety of constitution of the output level controller 410. Basic operation of embodiments illustrated in FIGS. 8 to 10 is similar to what is explained in FIGS. 4 to 7. In accordance with the present invention, the voltage level of signal outputted from the output level controller 410 is opposite to the voltage level of the signal outputted from the first and second pass gates 412 and 414 shown in FIGS. 4, 8 and 9, or the first and second tri-state inverters 415 and 416 shown in FIG. 20.

In FIG. 8, the output level controller 410 outputs the same logic value as that of the first and second input signals DATA 1 and DATA 2. The output level controller 410 outputs the signal opposite to the signal outputted from the first and second pass gates 412 and 414. Two resistors constituting the output level controller 410A have the same resistance value. Meanwhile, two resistors constituting the output level controller 410A have a resistance value in a manner that the output level controller 410A pre-drives the output node NODE A of the signal selector 400 and a driving power of the signal selector 400 is stronger than a driving power of the output level controller 410A.

When the voltage levels of the first and second input signals DATA 1 and DATA 2 are the same, an output signal of the output level controller 410A has the same voltage level as that of the first and second input signals DATA 1 and DATA 2. The voltage level of the output signal of the output level controller 410A is in opposite to the level of the output signal of the signal selector 400. Therefore, the output level controller 410A reduces the swing width of the output signal of the signal selector 400. In addition, when the voltage levels of the first and second input signals DATA 1 and DATA 2 are different, the output level controller 410A pre-charges the output node, NODE A. Therefore, fast swing operation is possible.

A high signal and low signal instead of a clock signal is inputted to the pass gates constituting the output level controller 410B of FIG. 9. Therefore, the pass gates constituting the output level controller 410B always maintain statement turned on.

When the voltage levels of the first and second input signals DATA 1 and DATA 2 are the same, an output signal of the output level controller 410B has the same level as the first and second input signals DATA 1 and DATA 2. The output signal of the output level controller 410B has the opposite level to the output signal of the signal selector 400. Therefore, the output level controller 410B reduces the swing width of the output signal of the signal selector 400. In addition, when the voltage levels of the first and second input signals DATA 1 and DATA 2 are different, the output level controller 410B pre-charges the output node NODE A of the signal selector 400. Therefore, fast swing operation is possible.

However, the pass gates constituting the output level controller 4108 are turned on weakly. Therefore, a driving power of the output level controller 4108 is stronger than a driving power of the signal selector 400.

The output level controller 410 of FIG. 10 is formed of four inverters. This constitution is caused by that the signal selector 400A is formed of the first and second tri-state inverters 415 and 416. When the voltage levels of the first and second input signals DATA 1 and DATA 2 are the same, the output signal of the output level controller 410 has the same level as the first and second input signals DATA 1 and DATA 2. The output signal of the output level controller 410 has opposite level to the output signal of the signal selector 400A. Therefore, the output level controller 410 reduces the swing width of the output signal of the signal selector 400A. In addition, when the voltage levels of the first and second input signals DATA 1 and DATA 2 are different, the output level controller 410 pre-charges the output node NODE A of the signal selector 400A. Therefore, fast swing operation is possible.

While the present invention has been described with respect to the specific embodiments, it will be apparent to those skilled in the art that various changes and modifications may be made without departing from the spirit and scope of the invention as defined in the following claims.

What is claimed is:

1. An output circuit of a semiconductor device, comprising:
   a signal selector configured to receive a plurality of input signals and sequentially output the plurality of input signals in response to a plurality clock signals; and
   an output level controller configured to receive the plurality of input signals and to control a voltage level of an output signal of the signal selector based on the plurality of input signals,
   wherein an output signal of the output level controller is obtained by combining the plurality of input signals.

2. The output circuit of claim 1, wherein the output level controller is configured to pre-drive an output node of the signal selector and to reduce the voltage swing of the output signal of the output level controller when the output signal of the output level controller has a low frequency.

3. The output circuit of claim 1, wherein the output circuit is configured to combine the output signal of the signal selector and an output signal of the output level controller at a common output node of the signal selector and the output level controller.

4. The output circuit of claim 3, wherein the output level controller includes:
   a first driver configured to output a signal to the output node of the signal selector based on the first input signal; and
   a second driver configured to output a signal to the output node of the signal selector based on the second input signal.

5. The output circuit of claim 1, wherein the output level controller is arranged to receive the plurality of input signals without having to pass the plurality input signals through the signal selector.

6. An output circuit of a semiconductor device, comprising:
   a signal selector configured to receive a plurality of input signals and sequentially output the plurality of input signals in response to a plurality clock signals; and
   an output level controller configured to receive the plurality of input signals and predrive an output node of the signal selector based on the plurality of input signals.

7. The output circuit of claim 6, wherein the output level controller is configured to reduce the voltage swing of an output signal of the output level controller when the output signal has a low frequency.

8. The output circuit of claim 6, wherein an output signal of the output level controller is obtained by combining the plurality of input signals.

9. The output circuit of claim 6, wherein the output circuit is configured to combine the output signal of the signal selector and an output signal of the output level controller at a common output node of the signal selector and the output level controller.

10. The output circuit of claim 6, wherein the output level controller is arranged to receive the plurality of input signals without having to pass the plurality input signals through the signal selector.

11. An output circuit of a semiconductor device, comprising:
    a signal transmitter configured to transmit a plurality of input signals to an output node in response to a control signal; and
    an output level controller configured to receive the plurality of input signals and to pre-drive the output node based on the plurality of input signals.

12. The output circuit of claim 11, wherein the output level controller is configured to reduces a voltage swing of the output signal when the output signal has a low frequency.

13. The output circuit of claim 11, wherein an output signal of the output level controller is obtained by combining the plurality of input signals.

14. The output circuit of claim 11, wherein the output circuit is configured to combine an output signal of the signal transmitter and an output signal of the output level controller at a common output node of the signal selector and the output level controller.

15. The output circuit of claim 12, wherein the output level controller is arranged to receive the plurality of input signals without having to pass the plurality input signals through the signal transmitter.

* * * * *

UNITED STATES PATENT AND TRADEMARK OFFICE
CERTIFICATE OF CORRECTION

PATENT NO.       : 8,248,103 B2  
APPLICATION NO.  : 13/043873  
DATED            : August 21, 2012  
INVENTOR(S)      : Chang-Kyu Choi et al.

Page 1 of 1

It is certified that error appears in the above-identified patent and that said Letters Patent is hereby corrected as shown below:

Title Page

Insert U.S. Patent Nos. and Taiwanese Office Action as follows:

-- (56)      References Cited

U.S. PATENT DOCUMENTS 6,373,291  B1   4/2002 Hamada et al. ......................  
6,124,736       9/2000 Yamashita et al. .....................

OTHER PUBLICATIONS --

Signed and Sealed this  
Sixth Day of November, 2012

David J. Kappos  
*Director of the United States Patent and Trademark Office*